United States Patent
Sauer

(10) Patent No.: US 6,390,182 B1
(45) Date of Patent: May 21, 2002

(54) HEAT SINK ASSEMBLY

(75) Inventor: Scott B. Sauer, Rocklin, CA (US)

(73) Assignee: Powerwave Technologies, Inc., Santa Ana, CA (US)

(*) Notice: Subject to any disclaimer, the term of this patent is extended or adjusted under 35 U.S.C. 154(b) by 0 days.

(21) Appl. No.: 09/925,854

(22) Filed: Aug. 9, 2001

Related U.S. Application Data

(62) Division of application No. 09/658,159, filed on Sep. 8, 2000.

(51) Int. Cl.[7] .................................................. F28F 7/00
(52) U.S. Cl. .................................. 165/80.3; 29/890.03
(58) Field of Search .............................. 165/80.3, 185, 165/104.33; 361/605, 697, 704, 707, 709, 710, 724; 257/706, 722; 29/890.03

(56) References Cited

U.S. PATENT DOCUMENTS

| | | | | |
|---|---|---|---|---|
| 3,327,779 A | * | 6/1967 | Jacoby ........................ 165/80.3 |
| 4,147,752 A | * | 4/1979 | Suovaniemi et al. ........... 422/57 |
| 4,177,499 A | * | 12/1979 | Volkmann ..................... 361/605 |
| 4,356,864 A | * | 11/1982 | Ariga et al. ................. 165/80.3 |
| 5,428,503 A | * | 6/1995 | Matsushima et al. ......... 361/695 |
| 5,589,711 A | * | 12/1996 | Sano et al. ................... 257/718 |
| 5,947,192 A | * | 9/1999 | Kuo ............................ 165/80.3 |
| 6,172,872 B1 | * | 1/2001 | Katsui ......................... 361/695 |
| 6,244,332 B1 | * | 6/2001 | Gesklin et al. ............. 165/80.3 |

* cited by examiner

*Primary Examiner*—Henry Bennett
*Assistant Examiner*—Terrell McKinnon
(74) *Attorney, Agent, or Firm*—Myers, Dawes & Andras LLP

(57) ABSTRACT

A heat sink assembly for an electronics assembly, such as an RF power amplifier, includes a pallet, a fin structure, and a hollow base separate from the fin structure. The fin structure may be an integral curved sheet or a modular apparatus comprising a plurality of inverted U-shaped fin modules. Top horizontal walls of the fin structure directly contact a bottom surface of the pallet. Vertical fins of the fin structure are inserted through the slots of the base. The pallet, fin structure and base are coupled together such that the upper surface of the base applies load to the contact portions of the fin structure sandwiched between the base and the pallet. Methods for assembling a power amplifier and manufacturing a heat sink assembly are also provided.

24 Claims, 6 Drawing Sheets

HEAT SINK ASSEMBLY

RELATED APPLICATION INFORMATION

The present application is a divisional application of U.S. Ser. No. 09/658,159 filed Sep. 8, 2000.

BACKGROUND OF THE INVENTION

1. Field of the Invention

The present invention relates generally to heat sinks for electronics assemblies, such as RF power amplifiers. The invention further relates to methods of manufacture of electronics assemblies incorporating heat sinks.

2. Description of Related Art

Numerous electronic processes generate waste heat. For example, in the case of RF power amplifiers for cellular phone base stations, the amplification methods used to achieve the required linearity and low noise operation produce large amounts of waste heat which must be removed in order to preserve the efficiency, operating characteristics and the life of an amplifier. In most applications, this waste heat must be dissipated via heat transfer to ambient air forced through the electronics assembly by a fan. Due to the low heat transfer rate to air via convection, however, the ability to transfer heat merely by fan cooling is inadequate for many applications. Heat sinks serve to greatly improve the waste heat transfer rate by providing large surface areas, such as fins, to dissipate the heat into the air. Therefore, large area heat sinks are critical for many applications where significant heat is generated by the electronics assembly.

Important characteristics of such heat sinks are low cost, light weight, ease of assembly and good thermal transfer properties. These characteristics are difficult to achieve together, however, since good thermal transfer properties typically require relatively expensive materials and manufacturing techniques. In particular, good thermal transfer properties typically require a heat sink material with high thermal conductivity to efficiently transfer heat to the fins, and thin closely spaced fins to maximize contact area with the air. These features, however, typically require a more expensive material and/or a more expensive manufacturing process. This may be best appreciated by considering specific examples of common heat sink structures.

The least expensive type of heat sink is the die cast heat sink. A typical die cast heat sink includes a base and heat dissipation fins as a single integral structure made of the same die cast material, such as aluminum. The die cast heat sink is a very desirable manufacturing method from a cost standpoint as the majority of mounting features, clearance holes, shielding features, etc., can be directly cast into the base eliminating costly secondary machining operations. The die casting process, however, inherently limits the thermal conductivity of the material as well as the thickness of the fins and the spacing between the fins. These limitations prevent die cast heat sinks from being used for high power density electronics assemblies, such as RF power amplifiers, which require greater thermal performance.

Extruded heat sinks are commonly used for high power amplifiers because the extrusion process provides better thermal conductivity due to reduced porosity in the metal and also enables a reduced fin thickness and spacing over die casting. Although extruded heat sinks achieve the desired fin thickness and spacing, extensive additional machining is required to create mounting features, clearance holes and shielding features, etc., in an extruded heat sink. Also, most extruded heat sinks include some grade of aluminum because of its relatively low cost, manufacturability and heat transfer characteristics. Aluminum does not have a sufficiently high conductive heat transfer rate, however, for more demanding applications such as some RF power amplifiers.

FIG. 1 is a side elevation view of such an extruded heat sink according to the prior art. The heat sink 5 comprises a base 6 that is integral with the fins 7, which is typically extruded and then machined. As noted above, it is formed out of an aluminum material having insufficient thermal conductivity for demanding applications, such as RF power amplifiers. Therefore, an additional plate 8 of a material having a higher thermal conductivity, such as copper, is disposed between the sink and the electronics assembly generating the heat. Without the additional intermediary plate 8, the heat sink 5 would not be able to absorb and dissipate the heat from the electronics assembly quickly enough. The copper plate 8, however, adds to the cost and weight of the heat sink. Furthermore, while the copper plate 8 serves to spread the heat quickly through the aluminum base 6, nonetheless the lower heat transfer rate of the aluminum reduces the heat transfer efficiency out into the fins 7. Therefore, despite the relatively high cost of the heat sink of FIG. 1, its performance is still not as good as desired for some applications.

Therefore, what is needed is a heat sink that can provide the above noted characteristics of low cost, light weight, ease of assembly and good thermal transfer properties, which characteristics have been mutually incompatible in the prior art.

SUMMARY OF THE INVENTION

The present invention provides structures and methods which overcome the deficiencies in the prior art.

In one aspect, a low cost, high performance heat sink assembly is provided. The heat sink assembly comprises a hollow base, having an air flow path therethrough and one or more apertures, and a fin structure having contact portions mounted to the base and fins extending from the contact portions through the apertures of the base. The base comprises a first material having a first thermal conductivity, while the fin structure comprises a second material having a second thermal conductivity that is higher than the first thermal conductivity. For example, the first material may comprise die cast aluminum, and the second material may comprise copper. The fin structure may comprise an integral or a modular structure. The assembly may further comprise a fastener coupling the fin structure to the base.

Since the base of the heat sink assembly may comprise a relatively inexpensive material which may be die cast to the appropriate shape and with the desired mounting holes, a relatively low cost assembly may be provided. Also, since the heat transfer and dissipation is provided by a higher thermal conductivity material, such as copper, relatively high performance may be provided.

In another aspect, an electronics assembly is provided. The electronics assembly comprises an electronics module, such as a pallet having electronic components mounted thereon, a fin structure having a contact portion contacting a bottom surface of the module and fins extending from the contact portion, and means to apply load to the contact portion of the fin structure such that the contact portion directly contacts the bottom surface of the module.

In a further aspect, an RF power amplifier according to the invention comprises a housing, at least one amplifier module disposed within the housing, a pallet composed of a thermally conductive material coupled to a bottom of the amplifier module, a fin structure attached to the pallet, the fin structure having contact portions that are in direct contact with a lower surface of the pallet and fins extending from the contact portions, and a base supporting the fin structure and having an air flow path therethrough and one or more apertures through which the fins extend into the air flow path.

Methods of assembly and manufacture are also provided. A method for assembling an electronics assembly comprises providing an electronics module, such as a pallet having electronic components thereon. A fin structure having contact portions and fins extending from the contact portions is mounted to a bottom surface of the pallet via the contact portions of the fin structure and load is applied to the contact portions of the fin structure such that a substantial area of the contact portions is in direct thermal contact with the bottom surface of the pallet.

A method for manufacturing a heat sink assembly comprises providing a hollow base and providing a fin structure, that is separate from the base, by a separate process. For example, the base may be formed by die casting while the fin structure may be formed by stamping a thin sheet of copper to a desired shape. The fin structure may be completed by forming contact portions and fins in the fin structure, for example, by bending the copper sheet. The heat sink assembly is completed by coupling the base to the fin structure.

It will be appreciated that the above summarized methods of assembly and manufacture can provide a high performance heat sink having closely spaced fins within a relatively inexpensive process.

The invention, now having been briefly summarized, may be better appreciated by the following detailed description.

DETAILED DESCRIPTION OF THE PREFERRED EMBODIMENTS

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

Figure 1:
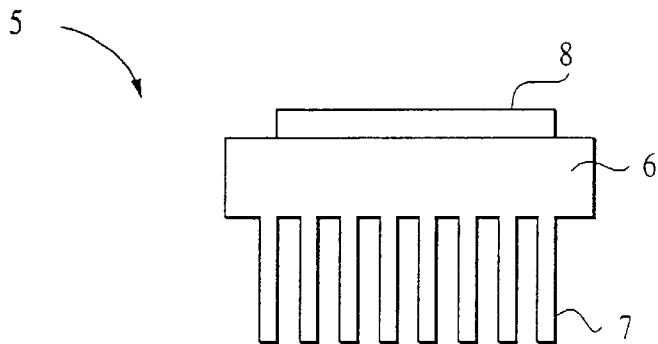
FIG. 1 is a side elevation view of a prior art heat sink.
Figure 2:
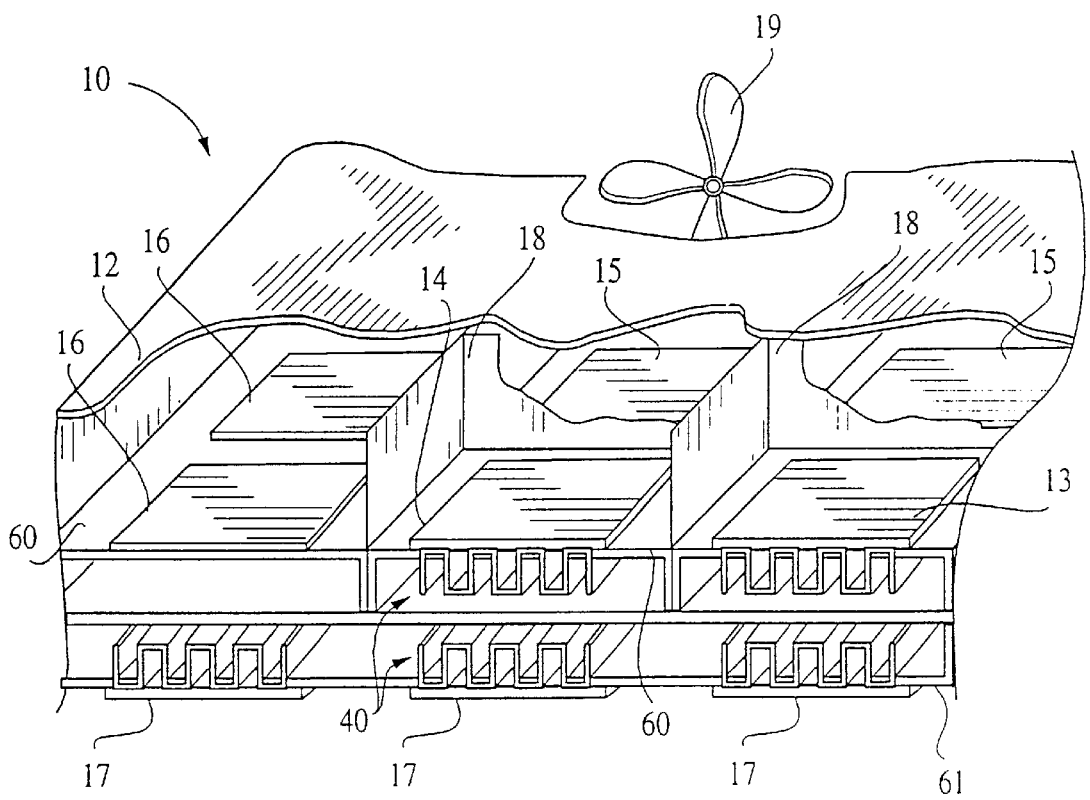
FIG. 2 is a cutaway perspective view of an electronics assembly in accordance with the present invention.

FIG. 2 is a cutaway perspective view of an electronics assembly 10, incorporating a heat sink for heat dissipation, in accordance with the present invention. The electronics assembly 10 may comprise an RF power amplifier or other electronic device generating sufficient heat to require a heat sink. The electronics assembly 10 comprises a housing 12 in which a plurality of electronic modules 13, 14, 15, 16, 17 are disposed on one or more layers, two layers being illustrated. The modules may include integrated circuits, discrete components, interconnects and other well known circuit elements. These circuit elements may be mounted on a pallet, a printed circuit board, or other support. Each module thus comprises an assembly of electronic components which includes a support disposed at the bottom of the assembly. The electronic assemblies are supported by a base 60 and a base 61. FIG. 2 also shows a finned heat sink structure 40 according to the invention for absorbing and dissipating heat generated by certain of the electronic modules. In many applications having plural electronic modules, not all may generate sufficient heat to require heat sinks. Therefore, to save costs, heat sinks are provided only on modules where they are necessary. A fan 19 is configured to provide air flow along the longitudinal direction of the walls of the fin structure 40 as described in more detail further below.

As noted above, the electronics assembly 10 of FIG. 2 may comprise an RF power amplifier. In such case, electronics of the amplifier 10 may include the disclosure provided by U.S. Pat. No. 5,796,304 to Gentzler, which is incorporated by reference as though fully set forth herein. In such an embodiment, different modules may comprise an input amplifier 13, error amplifier 14 and main amplifier 17, each of which will have an associated heat sink comprising a fin structure 40. The main amplifier may comprise a plurality of separate modules 17 mounted in a single base 61, as illustrated. The input amplifier module 13 and error amplifier module 14 in turn may be mounted in separate bases 60, in RF isolated compartments via shielding walls 18, as also illustrated. Also, the control circuitry for the amplifier 10 may be provided in a PCB assembly 16 situated in an RF shielded compartment, separated by a shielding wall 18, from the power amplifier modules 13 and 14. Typically, the control electronics will not generate sufficient heat to require a heat sink, so control module(s) 16 are illustrated without a heat sink. Additional modules 15 may also be provided which contain circuitry, such as phase control circuitry, etc., which do not generate sufficient heat to require heat sinking.

It should be appreciated that the specific illustration of the electronics assembly shown in FIG. 2, as well as subsequent illustrations of components thereof and alternate embodiments, is provided for convenience of illustration and explanation rather than accuracy of layout, etc. For example, the various elements are not shown to scale or necessarily in optimal configuration. For example, the heat generating modules 13, 14 and/or 17 may be configured to be spaced further apart, e.g., on diagonally opposite locations in the housing to minimize heat build up. Also, the specific opposed two layer configuration of modules is purely illustrative and a variety of different multiple or single layer configurations of modules may be employed.

Figure 3:
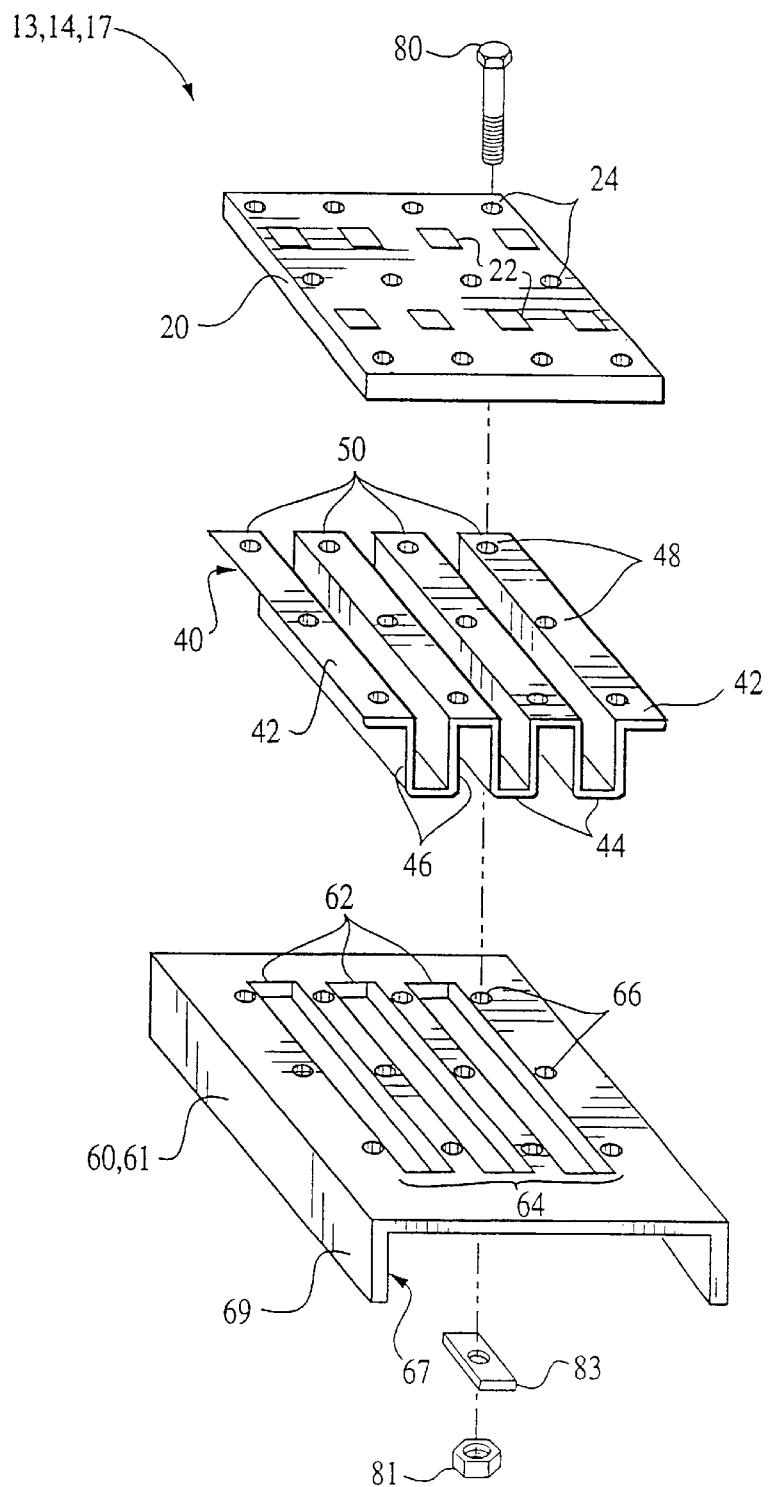
FIG. 3 is an exploded view of a heat sink assembly in accordance with the present invention.

FIG. 3 is an exploded view of an electronics module, e.g., module 13, 14 or 17 illustrated in FIG. 2, incorporating a heat sink assembly. The heat sink assembly comprises a heat transfer support 20, a fin structure 40, a slotted base 60, and a fastener 80 to couple the heat sink assembly together. The support 20 preferably comprises a pallet composed of a metal with a high thermal conductivity, such as copper. The pallet 20 acts as a support for the electronic circuitry and provides a good thermal connection thereto, e.g., via a thermally conductive bonding material. For less demanding applications, however, the support 20 may be replaced with a conventional PCB or other support for the electronics components. The electronics may include heat generating elements, such as transistors, 22. These thus form potential hot spots. In the preferred embodiment wherein the heat sink assembly is coupled together by bolts, rivets, or like fasteners 80, apertures or bores 24 are defined in the pallet 20 for receiving the fasteners 80. The apertures 24 are configured to align with apertures 48 defined in the fin structure 40. The base 60 includes a plurality of base apertures 66 configured to align with the fin apertures 48 and pallet apertures 24. A nut 81 engages the bolt 80 and secures the assembly. An optional washer 83 may be employed which distributes the force more evenly along the contact surface. An alternate method of assembly is to thread the bolt 80 directly into the base 60 or the support 20.

FIG. 3 shows one embodiment of the fin structure, or fin apparatus, 40 being an integral, or unitary, corrugated sheet 40. In this embodiment, the fin structure 40 comprises a plurality of top walls, or top portions, 42 and bottom walls, or bottom portions, 44 arranged in alternating fashion and connected by fins 46. The resulting shape comprises a repeating "S" design. Fin apertures 48 are defined in the top walls 42 and configured to aligned with the pallet apertures 24 and base apertures 66. As will be described in more detail in FIG. 4, the top walls 42 collectively form contact portions 50 of the fin structure 40. For optimum transfer of heat in a preferred embodiment, the locations of these contact portions 50 are chosen to lie beneath the hot spot elements 22. The fin structure 40 comprises a material with a high thermal conductivity which is not necessarily the same material as that of the pallet 20. Thus, in a less demanding application, the pallet 20 may comprise aluminum while the fin structure 40 comprises copper. Since copper is relatively expensive, alternative embodiments for less demanding applications may include a pallet composed of aluminum and a fin structure composed of sheet or extruded aluminum. Since sheet and extruded aluminum have a higher thermal conductivity than die cast aluminum, a heat sink assembly formed according to the invention with an aluminum pallet and fin structure would nonetheless provide higher thermal capability than a die cast aluminum base and fin structure. In the preferred embodiment, however, both the pallet 20 and the fin structure 40 comprise copper, thereby providing a direct copper to copper contact. This provides excellent heat conduction into the fins. This fin structure also offers several additional advantages over the prior art as will be described further below.

In FIG. 3, the base 60 is shown to be sized for assembly with a single pallet 20 and the fin structure 40 to comprise a single heat sink assembly. However, in an electronics assembly such as an RF amplifier wherein several pallets may be disposed side by side on the same base, such as base 61 shown in FIG. 2, the base 61 may be an integral structure having a plurality of grouped slots 62 wherein each group 64 of slots 62 receives a fin structure 40 and matching pallet 20. Thus, an RF amplifier built according to the present invention may include several heat sink assemblies and pallets with one common base that is shared by all the heat sink assemblies. This provides an easily assembled structure with a well defined air flow passage. Alternatively, a plurality of bases may be provided.

The base 60, 61 is hollow such that an air flow path 67 is defined by its body 69. The base 60, 61 may have an open inverted U-shape as illustrated or may be a hollow box shape open at both ends, i.e. corresponding to the illustrated shape with a bottom wall. Other base shapes and configurations may also be employed.

Since the base 60 is separate from the fin structure 40 and need not be part of the heat transfer path, the base 60 need not be specially adapted for heat transfer. Therefore, the base 60 need not be extruded and machined as: in the prior art heat sinks described above. Instead, the base 60 may simply be die cast which is substantially less expensive than manufacturing by extrusion and machining. Also, unlike prior art heat sinks, since the base 60 does not serve to absorb or dissipate heat, the base 60 may comprise a material having a lower thermal conductivity, and thus a lower cost, than that of the pallet 20 or fin structure 40. For example, the base 60 may comprise die cast aluminum or plastic, which are much less expensive than copper.

Figure 4:
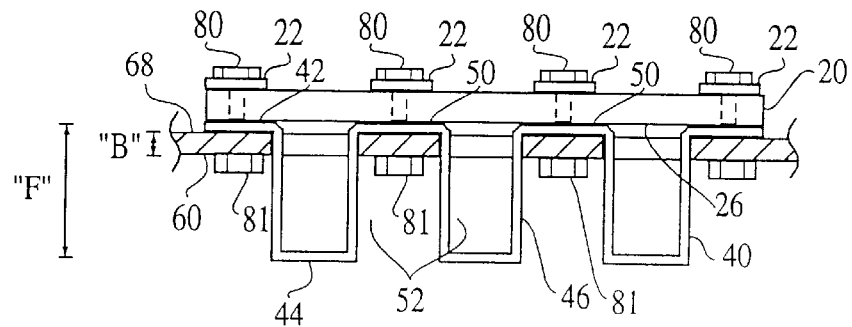
FIG. 4 is a cross-sectional view of a portion of the heat sink assembly of FIG. 3.

FIG. 4 is a cross-sectional view of the embodiment of FIG. 3 as assembled. The fasteners 80, shown here as bolts, are inserted through the pallet apertures 24, the fin apertures 48, and the base apertures 66 shown in FIG. 3. The top walls 42 of the fin structure 40 collectively form the horizontal contact portions 50 of the fin structure 40 that are in direct contact with a bottom surface 26 of the pallet 20. As noted above, the contact portions 50 provide a direct conductive thermal path such that heat from the transistors 22 is transferred to the pallet 20 and then directly to the fin structure 40. Since the fin structure 40 and the pallet 20 preferably comprise copper, this copper to copper contact creates a highly effective absorption and dissipation of heat unlike prior art heat sinks which may involve heat transfer from a higher thermally conductive material to a lower thermally conductive material.

The base 60 need not contact the pallet 20 since the fin structure 40 substantially performs the heat absorption and dissipation from the pallet 20. Instead, the base 60 serves primarily to apply contact load to the top walls 42 such that a sufficient area of the contact portion 50 of the fin structure 60 is in direct compressive contact with the pallet 20. More specifically, the upper surface 68 of the base 60 presses up against the top walls 42 of the fin structure 40 by virtue of the fasteners 80 coupling the entire heat sink assembly. The upper wall of the base 60 has a thickness "B" that is much less than the depth "F" of the fins 46 of the fin structure 40. This reduces the weight of the base 60 and maximizes the distance that the fins 46 extend beneath the base 60. This maximizes the portion of the fins 46 exposed to air flow generated by the fan 19 in the amplifier 10, shown in FIG. 2. The air flow is provided along both the inner and outer channels created by the fins 46 and the bottom walls 44 to create air passageways 52 for air to flow through. If a washer 83 (shown in FIG. 3) or other force distribution means is employed, the base underlying the fin structure may even be dispensed with and the fins secured directly to the pallet and supported thereby. This may further reduce weight and may be employed where weight is a key factor.

Figure 5:
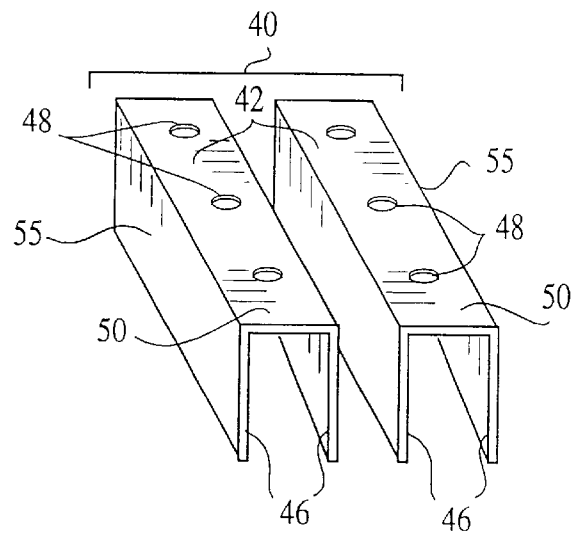
FIG. 5 is a perspective view of an alternate embodiment of the fin structure comprising several separate fins.

FIG. 5 is a perspective view of an alternate embodiment of the fin structure 40. In FIG. 5, the fin structure 40 is shown as a modular, non-integral embodiment comprising a plurality of separate U-shaped members, or fin modules, 55. Each inverted U-shaped fin module comprises a top wall 42 and a pair of fins 46 extending from the edges of the top wall 42. Fin mounting apertures 48 are defined in the top walls 42 and configured to align with the pallet apertures 24 and the base apertures 66 shown in FIG. 3. Similar to the integral fin structure 40 of FIGS. 3 and 4, the top walls 42 of the modular fin structure 40 in FIG. 5 collectively form the contact portions 50 of the fin structure to be disposed in direct compressive contact with the pallet 20 as shown in FIG. 6.

Figure 6:
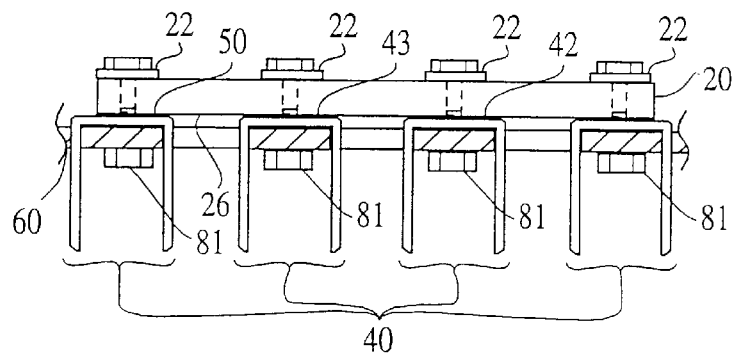
FIG. 6 is a cross-section view of a heat sink with the fin structure of FIG. 5.

FIG. 6 is a cross-sectional view of a heat sink assembly with the modular fin structure 40 of FIG. 5. The structure and operation of the assembly in FIG. 6 are substantially similar to those of the assembly in FIG. 4 except that the modular fin structure 40 of FIG. 6 lacks the bottom walls 44 of the integral fin structure 40 of FIG. 4. Similar to the embodiment in FIG. 4, the contact portion 50 of the fin structure 40 is sandwiched between the pallet 20 and the base 60, with the top surface 43 of each top wall 42 directly contacting the lower surface 26 of the pallet 20. Since bottom walls are lacking in the modular fin structure 40 of FIG. 6, the modular fin structure 40 provides less surface area than the integral sheet 40 of FIGS. 3 and 4. Depending upon the heat dissipating requirements as necessitated by the particular electronics assembly, the modular fin structure of FIGS. 5 and 6 may be more cost effective over an integral sheet since the modular fin structure comprises less material than an integral fin structure and involves a less demanding manufacturing process and less demanding tolerances.

As examples and not by way of limitations, the following ranges are provided to clarify the dimensions of the fin structure. The thickness of the fins may be about 0.1 inches or less for a fin height of about 1 inch or greater. The spacing of the fins may be about 0.3 inches center to center or less. The height of the fins 46 may increase or decrease these ranges as the fin height is increased or decreased, respectively.

Figure 7:
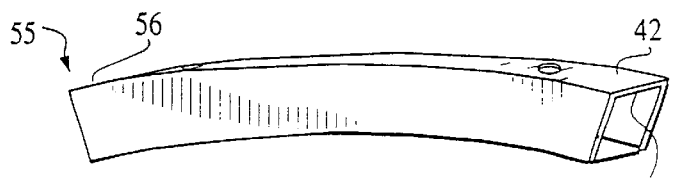
FIG. 7 is a perspective view of alternate embodiment of the fin structure having a bowed structure.

FIGS. 7, 8, 9, 10a, 10b, 11a, and 11b show alternative embodiments of single fin modules 55 comprising a modular fin structure. FIGS. 7–9 illustrate alternative embodiments wherein contact load may be provided by the fin module 55 itself, thus obviating the need for a base. A variety of methods are also disclosed in U.S. patent application Ser. No. 09/466,099 entitled "METHOD FOR UNIFORM LOADING OF A LID", which is incorporated by reference as though fully set forth herein.

Figure 8A:
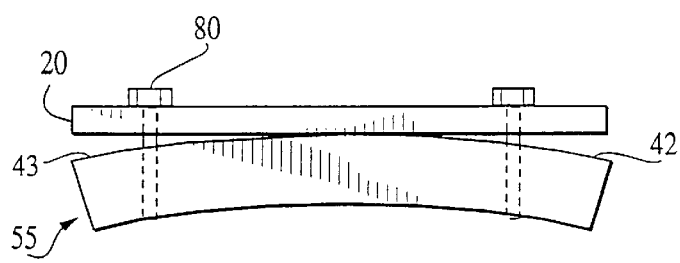
FIG. 8a is a side elevation view of an alternate heat sink assembly with the fin structure of FIG. 7.
Figure 9A:
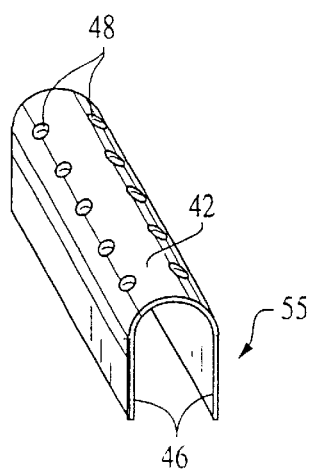
FIG. 9a is a perspective view of an alternate embodiment of the fin structure having a top wall curved from one fin to the other.
Figure 8B:
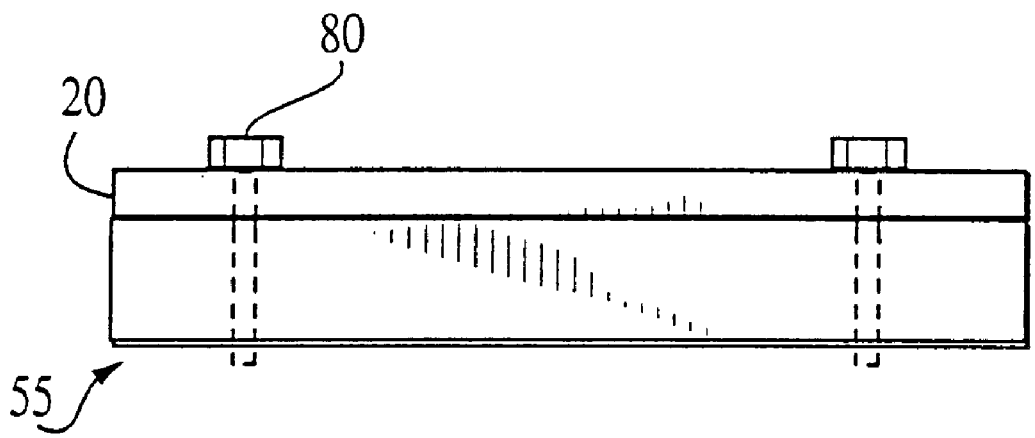
FIG. 8b is a side elevation view of the alternate heat sink assembly in FIG. 8a wherein the fasteners are tightened.
Figure 9B:
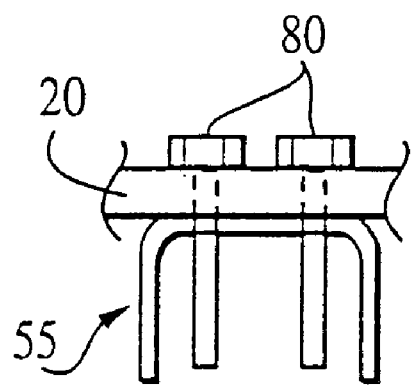
FIG. 9b is a front end view of a heat sink assembly incorporating the alternate embodiment of the fin structure in FIG. 9a when the fasteners are tightened.

In FIGS. 7 and 8, an embodiment of a fin module 55 with the top wall 42 bowed from one end 56 to the other end 57 is illustrated. Since the top wall 42 is curved away from the pallet 20, this curvature of the top wall 42 serves to apply contact load when coupled by the fasteners 80 such that a sufficient area of the top surface 43 may contact the bottom surface 26 of the pallet 20. Therefore, as shown in FIG. 8a, the base may be omitted since the curvature of the top wall 42 may be sufficient to apply the contact load necessary for good thermal transfer as the fin module 55 is held by fasteners 80. When the fasteners 80 are tightened as shown in FIG. 8b, the top wall of the fin module 55 becomes substantially flat from end to end. The same principle applies for the alternate embodiment of a single fin module 55 shown in FIG. 9a wherein the top wall 42 is curved from one fin 46 to the other 46 and a double row of fastening locations 48 is provided as illustrated. When the fasteners 80 are tightened as shown in FIG. 9b, the top wall of the fin module 55 becomes substantially flat from side to side. Thus, the top wall may be curved, or bent, from end to end, as shown in FIG. 7, or from side to side, as shown in FIG. 9a. The bending of the top walls 42 shown in FIGS. 7–9b may also be applied to the integral fin structure 40 of FIGS. 3 and 4.

Figures 10A, 10B:
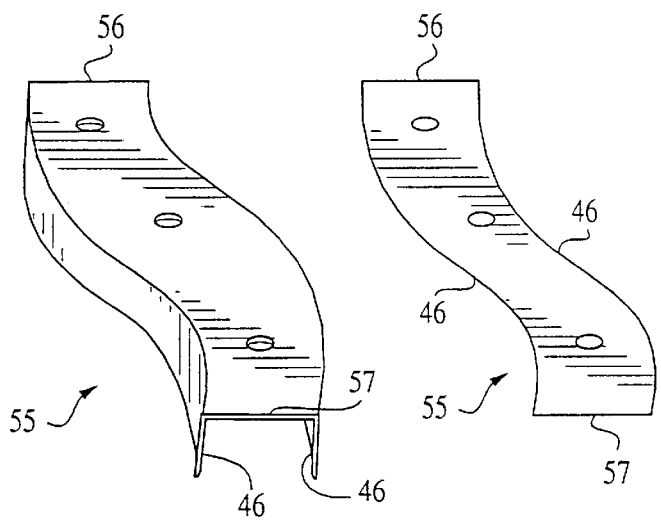
FIG. 10a is a perspective view of an alternate embodiment of the fin structure wherein the fins are curved from end to the other.
FIG. 10b is a bottom view of the fin structure in FIG. 10a illustrating the curvature of the fins.
Figure 11A:
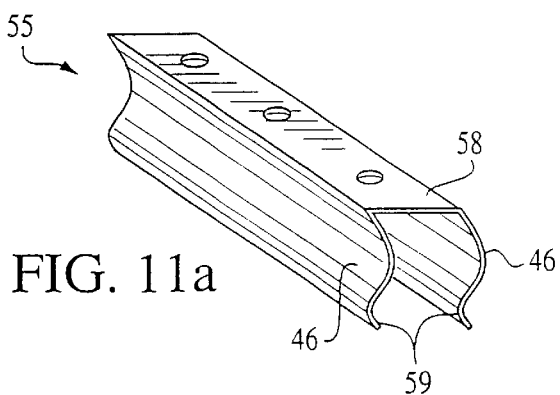
FIG. 11a is a perspective view of an alternate embodiment of the fin structure wherein the fins are curved from top to bottom.
Figure 11B:
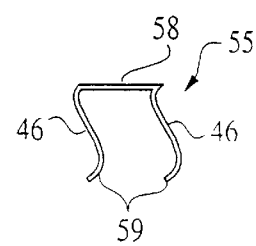
FIG. 11b is an end view of the fin structure of FIG. 11a; as assembled diagram illustrating a preferred embodiment of the process and system.

FIGS. 10a, 10b, 11a and 11b show alternate embodiments wherein the top wall is planar, but the fins are non-planar. Such embodiments may be used to create more air turbulence thus effecting a higher rate of heat dissipation from the fin module 55 to the air. In FIGS. 10a and 10b, the fins 46 may be curved from one end 56 to the other end 57 of the fin module 55. In FIGS. 11a and 11b, the fins 46 may be curved from a top 58 to a bottom 59 of the fin module 55. In addition to a relatively gentle curvature of the fins 46 as generally illustrated, a more fine grained curvature or corrugation may be provided to the fins 46. Also, the fins 46 may be roughened to increase the turbulence in the contact area with the air flow thereby increasing the heat transfer rate.

Figure 12:
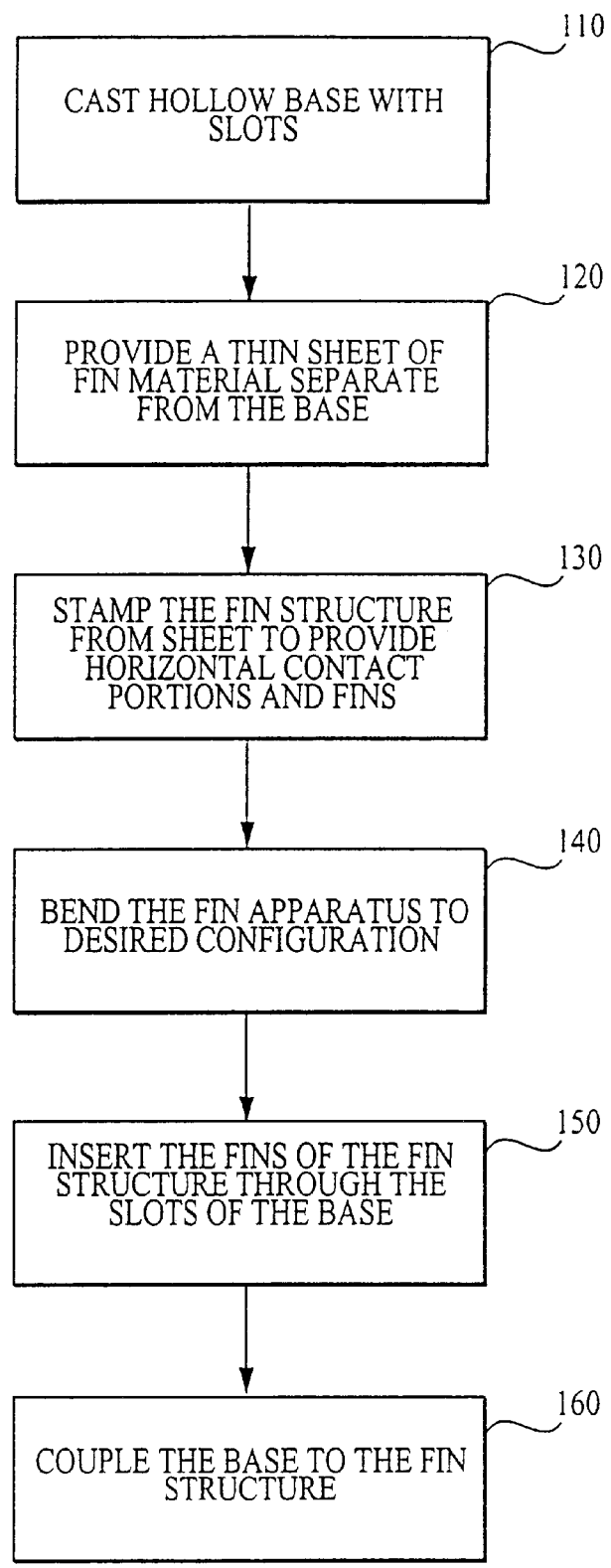
FIG. 12 is a flow diagram illustrating the process of manufacturing a heat sink assembly in accordance with the present invention.

FIG. 12 is a flow diagram illustrating the process of manufacturing a heat sink assembly in accordance with the present invention. In step 110, a hollow base having slots for receiving a fin structure is formed, e.g., by die casting. Since the base is separate from the fin structure, and not employed for heat transfer, the base may be die cast out of a relatively inexpensive material such as aluminum. If fasteners are to be used to couple the heat sink assembly, then step 110 may also include forming apertures in the base to receive the fasteners. As will be described later in the step 160 of coupling the base to the apparatus, if materials other than bolt fasteners are used, such as epoxy, then apertures need not be formed in the base or the fin structure.

In step 120, the fin material is provided, e.g., as a copper sheet. In step 130, the fin material is stamped to form horizontal contact portions and vertical portions. If the fin structure is desired to be one integral structure, a single thin sheet is stamped to provide a unitary corrugated fin structure. If a modular fin structure is desired, then a thin sheet may first be divided into parts, and then stamped to provide a plurality of separate U-shaped fins. Alternatively, the sheet may first be stamped and then divided to form the separate fins. One manufacturing advantage of this process is that the same stamping machine may be used regardless of whether an integral or modular fin structure is desired. Also, in the preferred embodiment, thin sheets of copper are used allowing automation of the stamping process. As part of this step 140, the mounting apertures in the fin structure may be formed, e.g., by stamping or punching holes through the thin sheet.

The fin structure is bent to the desired configuration in step 140. After the fin structure is bent in step 140, or if the fin structure need not be bent at all, the fins of the fin structure are then inserted through the slots of the base in step 150. In step 160, the base is coupled to the fin structure. This may comprise inserting bolts or other fasteners such as rivets through the apertures in the fin structure and base. The step 160 of coupling the base to the fin structure may also comprise the step 150 of inserting the fins through the base slots since these steps may be performed concurrently when both the base and fin structure are fastened to the pallet, e.g., if a bonding, soldering or similar mounting technique is employed.

The present invention also provides an improved method for assembling an electronics assembly such as an RF power amplifier. The assembly method includes providing a housing and disposing a plurality of electronic modules, for example, including power amplifier circuits and control circuits, within the housing. A pallet is coupled to the bottom of one or more of the electronic modules. The pallets are preferably made of copper so as to comprise the same material as the fin structure. The method includes either originally forming the pallet as part of the electronics assembly or coupling a copper pallet to the bottom of an already formed electronics assembly wherein the copper pallet would serve as part of the heat sink assembly. The method also includes providing a fin structure with contact portions and fins extending from the contact portions. Since this step can be performed in the manufacturing process shown in FIG. 12, the assembly method may comprise the entire manufacturing process described above. The assembly method further comprises directly contacting a bottom surface of the pallet with the contact portions of the fin structure and applying load to the contact portions such that a substantial area of the contact portions is in direct contact with the bottom surface of the pallet. The steps of directly contacting the bottom surface of the pallet with the contact portions of the fin structure and applying load to the contact portions may be accomplished by fastening the fin structure to the pallet and may comprise step 160 described above. If the contact portions of the fin structure are bowed, then the fin structure may be fastened to the pallet without a base. If the contact portions are planar, then a slotted base would be coupled to the fin structure and the pallet to apply the load. If a base is used, the fins of the fin structure are inserted through the base slots and the horizontal contact portions of the fin structure are sandwiched beneath the pallet and above the base. If a fastener such as a bolt is used, then apertures are formed in the pallet, fin structure and base and configured to be in alignment so as to receive the bolt.

It will be appreciated that methods provided herein provide a much less expensive way of manufacturing a heat sink. Even though the preferred embodiment includes copper, which tends to be more expensive than aluminum, the greater thermal transfer properties of copper outweigh its higher cost. Also, only a relatively small amount of copper need be employed since the base need not be copper. With the direct copper to copper contact between the pallet and the fin structure, the copper is used efficiently to absorb and diffuse the heat. In order to minimize cost while providing sufficient heat transfer and dissipation, it will also be appreciated that heat sink assemblies may be fabricated according to the invention wherein other, less expensive materials, such as aluminum, may be used for the pallet and fin structure depending upon the thermal demands of the application.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what incorporates the essential idea of the invention.

What is claimed is:

1. A method for assembling an electronics assembly, the method comprising:

providing a housing;

providing an electronics module having one or more electronic components mounted on a pallet within the housing;

providing a fin structure with contact portions and fins extending from the contact portions;

contacting a bottom surface of the pallet with contact portions of the fin structure; and applying load to the contact portions of the fin structure by sandwiching the contact portions of the fin structure between a rigid load bearing member and the pallet such that a substantial area of the contact portions is in direct thermal contact with the bottom surface of the pallet.

2. The method of claim 1, wherein contacting a bottom surface of the pallet with contact portions of the fin structure comprises fastening the fin structure directly to the pallet.

3. The method of claim 2, wherein the housing comprises a base having apertures and wherein the rigid load bearing member comprises at least a portion of the base and wherein applying load to the contact portions of the fin structure comprises coupling the base to the fin structure and the pallet.

4. The method of claim 3, wherein coupling a base to the fin structure and the pallet comprises inserting the fins of the fin structure through the slots of the base.

5. The method of claim 3, wherein coupling a base to the fin structure and the pallet comprises:

forming an aperture in the pallet, the fin structure and the base; and inserting a fastener through the aperture of the pallet, the fin structure and the base.

6. The method of claim 3, wherein directly contacting a bottom surface of the pallet with contact portions of the fin structure comprises disposing the contact portions of the fin structure beneath the pallet and above the base.

7. The method of claim 1, wherein providing a fin structure comprises providing an integral corrugated sheet of high thermal conductive material.

8. The method of claim 1, wherein providing a fin structure comprises providing a plurality of inverted U-shaped fin modules.

9. A method for manufacturing a heat sink assembly comprising:

provided a base having one or more apertures;

providing a fin structure that is separate from the base;

forming contact portions and fins in the fin structure;

coupling the base to the fin structure such that the fins extend through the one or more apertures; and contacting a bottom surface of a pallet of an electronics assembly with the contact portions of the fin structure.

10. The method of claim 9, further comprising forming the pallet out of aluminum.

11. The method of claim 9, further comprising forming the pallet out of copper.

12. The method of claim 9, wherein providing a fin structure that is separate from the base comprises forming the fin structure out of aluminum.

13. The method of claim 9, wherein providing a base comprises die casting the base.

14. The method of claim 13, wherein die casting the base comprises die casting aluminum.

15. The method of claim 13, wherein die casting the base comprises die casting plastic.

16. The method of claim 9, wherein providing a base having one or more apertures comprises forming slots in the base.

17. The method of claim 16, wherein coupling the base to the fin structure comprises inserting the fins of the fin structure through the slots of the base.

18. The method of claim 9, wherein forming contact portions and fins in the fin structure comprises stamping a single sheet to provide an integral corrugated sheet.

19. The method of claim 9, wherein forming contact portions and fins in the fin structure comprises stamping a plurality of single layer sheets to form a plurality of U-shaped fin modules, wherein each U-shaped fin module comprises one of the contact portions and a pair of the fins extending from the contact portion.

20. The method of claim 19, further comprising curving the contact portion of each fin.

21. The method of claim 19, further comprising curving the fins of each fin module.

22. The method of claim 9, wherein:

providing a base comprises forming the base out of a first material having a first thermal conductivity; and providing a fin structure that is separate from the base comprises forming the fin structure out of a second material having a second thermal conductivity that is higher than the first thermal conductivity.

23. The method of claim 22, wherein forming the fin structure out of a second material having a second thermal conductivity that is higher than the first thermal conductivity comprises forming the fin structure out of copper.

24. The method of claim 23, wherein forming the base out of a first material having a first thermal conductivity comprises forming the base out of aluminum.

* * * * *

UNITED STATES PATENT AND TRADEMARK OFFICE
CERTIFICATE OF CORRECTION

PATENT NO. : 6,390,182 B1
DATED : May 21, 2002
INVENTOR(S) : Sauer

It is certified that error appears in the above-identified patent and that said Letters Patent is hereby corrected as shown below:

<u>Title page,</u>
Item [54], please delete the title and substitute the following for the title of the invention: -- METHOD FOR ASSEMBLING AN ELECTRONICS ASSEMBLY INCORPORATING A HEAT SINK --

Signed and Sealed this

Twenty-second Day of October, 2002

*Attest:*

JAMES E. ROGAN
*Attesting Officer*   *Director of the United States Patent and Trademark Office*